United States Patent [19]
Bell

[11] Patent Number: 5,886,539
[45] Date of Patent: Mar. 23, 1999

[54] COMMUNICATION WITHIN AN INTEGRATED CIRCUIT BY DATA SERIALIZATION THROUGH A METAL PLANE

[75] Inventor: Russell Bell, Austin, Tex.

[73] Assignee: Advanced Micro Devices, Ind, Sunnyvale, Calif.

[21] Appl. No.: 835,935

[22] Filed: Apr. 10, 1997

[51] Int. Cl.$^6$ ............. H03K 19/0175; H01L 23/58; H03M 9/00
[52] U.S. Cl. .................. 326/82; 326/86; 326/90; 341/100; 341/101; 257/48
[58] Field of Search ................ 326/82, 86, 90; 341/100, 101

[56] References Cited

U.S. PATENT DOCUMENTS

| | | |
|---|---|---|
| 5,132,572 | 7/1992 | Woo . |
| 5,220,216 | 6/1993 | Woo . |
| 5,227,679 | 7/1993 | Woo . |
| 5,264,745 | 11/1993 | Woo . |
| 5,349,612 | 9/1994 | Guo et al. . |
| 5,363,419 | 11/1994 | Ho . |
| 5,367,542 | 11/1994 | Guo . |
| 5,400,370 | 3/1995 | Guo . |
| 5,452,333 | 9/1995 | Guo et al. . |
| 5,457,336 | 10/1995 | Fang et al. . |
| 5,457,719 | 10/1995 | Guo et al. . |
| 5,576,554 | 11/1996 | Hsu ............................ 257/48 |

*Primary Examiner*—Michael Tokar
*Assistant Examiner*—Daniel D. Chang

[57] ABSTRACT

A circuit for communicating between structures of an integrated circuit through a metallized layer is provided in which parallel data bits are bundled into serial data packages, serialized and sent from a structure to the metallized layer. A destination structure receives the serial data package from the metallized layer and deserializes the package back into a parallel set of data bits. The metallized layer may extend over a significant portion of a substrate of a chip as a metallized data plane or metallized clock plane. Moreover, the metallized layer may be coupled to a pin to allow communications between structures of separate integrated circuits.

16 Claims, 5 Drawing Sheets

COMMUNICATION WITHIN AN INTEGRATED CIRCUIT BY DATA SERIALIZATION THROUGH A METAL PLANE

FIELD OF THE INVENTION

The invention relates generally to integrated circuits and more particularly to communication between components of an integrated circuit.

BACKGROUND OF THE INVENTION

Modern integrated circuits (or "chips") pass internal signals through layers of metallized strips that may be three or four levels deep. Referring to FIG. 1, depicted are three levels of metallized strips used to interconnect three structures or components, 100, 102, and 104. The top level comprises metallized strip 110 which is vertically coupled to structure 100 through conductor 120. In addition, metallized strip 110 is coupled to structure 104 through conductor 136.

The second level comprises metallized strip 112, coupled to structures 100, 102, and 104 through conductors 122, 128, and 134, respectively. The lowest level comprises two metallized strips 114 and 116. Metallized strip 114 is coupled to structures 100 and structures 102 through conductors 124 and 126, respectively, and metallized strip 116 is coupled to structures 102 and 104 through conductors 130 and 132, respectively.

The conductors and layers of metallized strips allow for chip structures to send signals to each other. For example, structure 100 sends a signal to structure 104 through conductor 120, metallized strip 110, and conductor 136. Structure 104 sends a signal to structure 102 through conductor 120, metallized strip 116, and conductor 130. In FIG. 1, the interconnections shown allow only one bit signals to be passed. To enable the communication of multiple bit data from structure to structure, on the other hand, a parallel series of conductors and metallized strips is conventionally employed, complicating the interconnection design.

As the number of structures increase, the number of interconnections increases exponentially. In this case, the metallized strips and conductors must snake through more levels of routing, complicating the design and manufacture of interconnections between structures.

Metallization technology has not advanced in terms of geometry reduction at the same rate as process technology. Another difficulty in reducing the geometry of interconnections is that the resistance of a conductor is inversely proportional to the cross-sectional area of the conductor. Thus, reducing the cross-sectional area of a conductor or metallized strip increases the resistance and hence power consumption of the chip.

Consequently, interconnection between structures of an integrated circuit continues to be problematic in chip design. In this case, it is desirable to reduce the number of separate metallized strips, the number of interconnection levels, and the amount of snaking throughout an integrated circuit.

SUMMARY OF THE INVENTION

According to the present invention, the foregoing and other objects and advantages are attained by a circuit for communicating between a first structure and a second structure of an integrated circuit. The first structure is coupled to a first digital, high-speed transceiver. The first transceiver is coupled a first conductor to a metallized strip. A second high-speed, digital transceiver is coupled to the metallized strip through a second conductor and to the second structure.

In accordance with another aspect of the invention, an integrated circuit comprises a substrate and a metallized data plane. On the substrate are components, each component with data serialization and serialization circuitry for shared communications coupled to the component and to the metallized data plane.

By serializing multiple bit data and dedicating a metallized data plane to passing information between structures within a chip, it is possible to provide more effective communications between structures. The geometry of conductors is simplified because the conductors need only to vertically extend to the metallized plane above, which is positioned above and accessible to every structure.

Still other objects and advantages of the present invention will become readily apparent from the following detailed description, wherein only the preferred embodiments of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

A circuit for communicating between structures of an integrated circuit is described. In the following description, for the purposes of explanation, numerous specific details are set forth to provide a thorough understanding of the present invention. It will be apparent, however, that the present invention may be practiced without these specific details. In other instances, well-known structures and devices are shown in block diagram form to avoid unnecessarily obscuring the present invention.

SERIALIZING PARALLEL DATA

Figure 1:
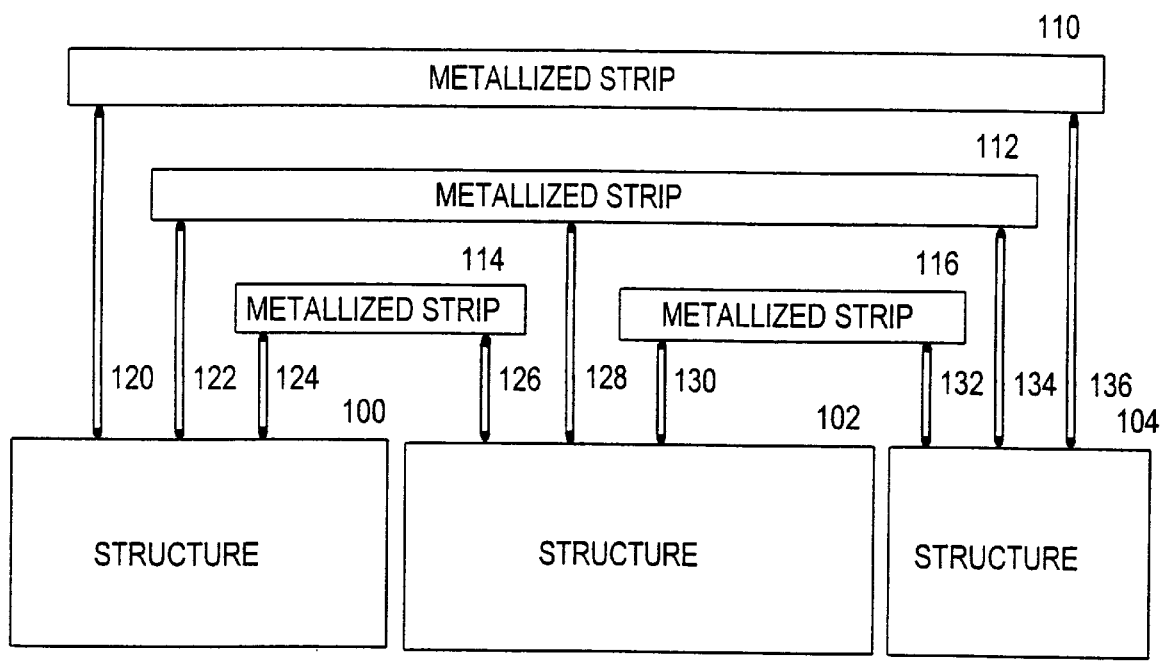
FIG. 1 is cross-sectional view of metallization planes in a conventional semiconductor die.
Figure 2:
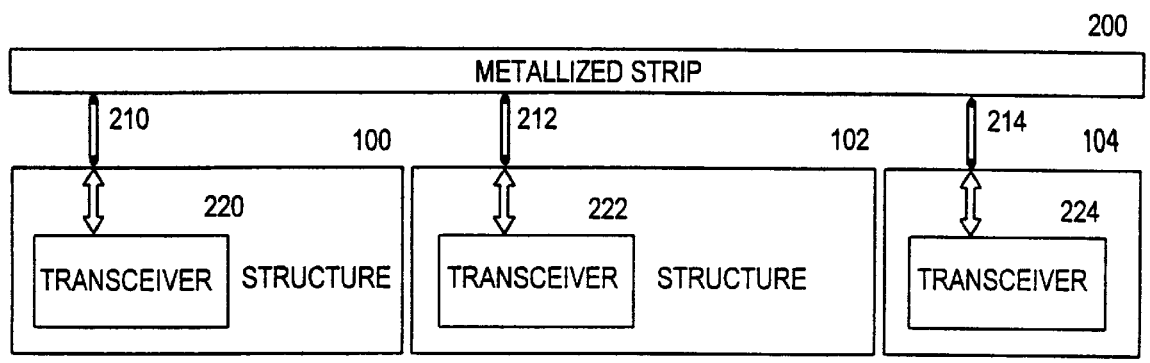
FIG. 2 is a cross-sectional view of a metallization plane in an embodiment of the invention.
Figure 3:
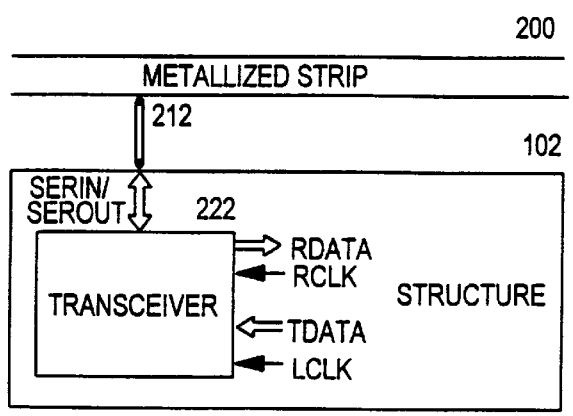
FIG. 3 is a block diagram of interconnection circuitry in another embodiment of the invention.

With reference to FIG. 2, metallized strip 200 is accessible to structures 100, 102, and 104 by conductors 210, 212, and 214. Within each structure is a high-speed, digital transceiver which interfaces the structure to the metallized strip by a conductor. Thus, structures 100, 102, and 104 comprise transceivers 220, 222, and 224, respectively. Referring to FIG. 3, transceiver 222 is representative of each transceiver. Transceiver 222 has a SERIN/SEROUT line, coupled to conductor 212 and presents two inputs, TDATA and LCLK, and two outputs, RDATA and RCLK, to structure 102.

Transceiver 222 receives parallel bit data and a clock signal through the TDATA and LCLK signals respectively, serializes the parallel bit data as a bit stream, embeds the clock signal in the bit stream, and outputs the bit stream to the SEROUT line. Transceiver 222 receives a bit stream through the SERIN line, deserializes the bit stream into parallel bit data for the RDATA output, and decodes the embedded clock signal for the RCLK output.

Figure 4A:
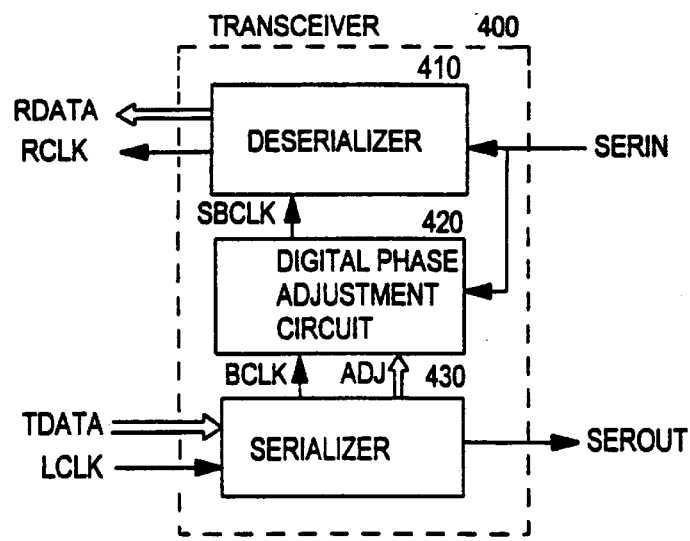
FIG. 4(a) is a block diagram of a transceiver in an embodiment of the invention.
Figure 4B:
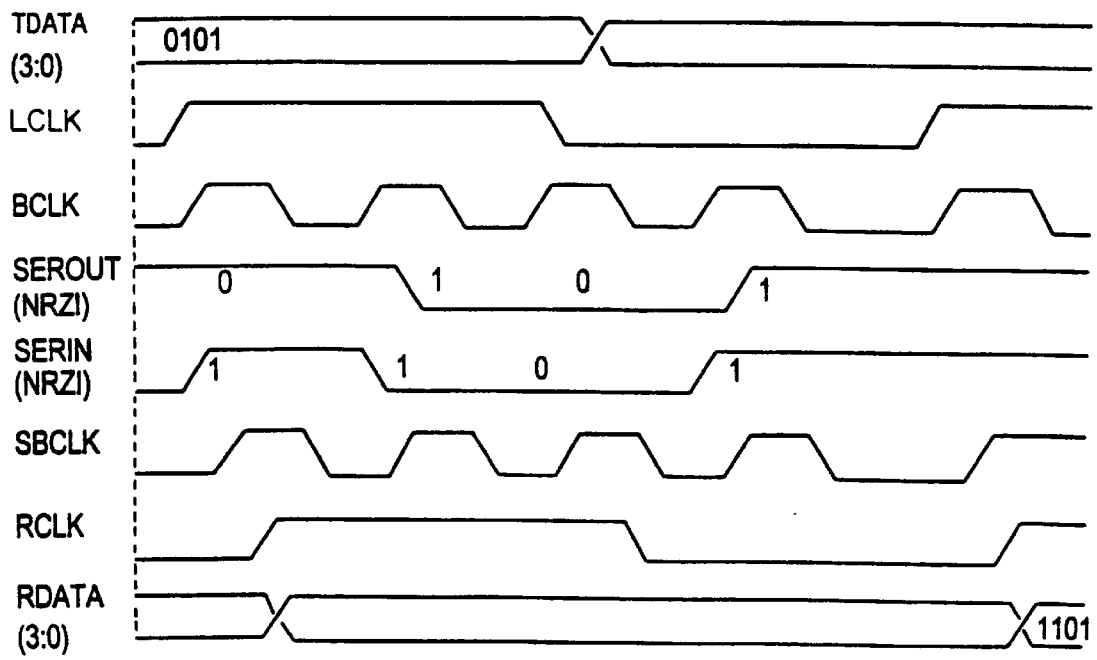
FIG. 4(b) is a timing diagram of an operation of a transceiver in an embodiment of the invention.

A preferred embodiment of the invention implements transceiver 222 as transceiver 400 of FIG. 4(*a*), a high-speed, all-digital serializer and deserializer described in U.S. Pat. No. 5,400,370 issued to Guo on Mar. 21, 1995, incorporated herein by reference. Transceiver 400 is all-digital, in that it does not implement large, lumped, analog components, such as capacitors, for data storage, timing or other functions, and hence readily implemented upon a large scale integrated circuit.

Transceiver 400 has three major components, deserializer 410, digital phase adjustment circuit 420, and serializer 430. Serializer 430, described in U.S. Pat. No. 5,349,612, issued to Guo et al. on Sep. 20, 1994, incorporated herein by reference, receives parallel data package TDATA, in N-bit nybbles clocked by local clock LCLK. The operation of serializer 430 in serializing an N-bit nybble TDATA is described with reference to the timing diagram in FIG. 4(*b*).

For each cycle of local clock LCLK, serializer 430 generates N cycles of bit clock BCLK, the first bit clock cycle being aligned with an edge of local clock LCLK. The period of bit clock BCLK is at most the period of local clock LCLK divided by N, but the bit clock period does not have to be an integral fraction of the local clock period. The cycles of bit clock BCLK are produced by a cascade of adjustable, digital delay elements, which are preferably calibrated by an on-chip digital servo subcomponent of serializer 430, described in U.S. Pat. No. 5,457,719, issued to Guo et al. on Oct. 10, 1995. The result of the calibration circuit is sent as signal ADJ from serializer 430 to also calibrate the adjustable, digital delay elements of digital phase adjustment circuit 420.

Given parallel data nybble TDATA and generated bit clock BCLK, serializer 430 encoding nybble TDATA into a bit stream SEROUT, which may be an ECL signal for high-speed transmission. One encoding, as shown in FIG. 4(*b*) is NRZI (Non-Return to Zero, Invert on one), where a transition signifies a one and a lack of a transition signifies a zero. Other encodings such as NRZ or Manchester may be used as well in other embodiments of the invention.

When transceiver 400 receives a incoming serial data stream SERIN, the clock signal for incoming serial data stream SERIN is generally out of phase with respect to bit clock BCLK. Therefore, digital phase adjustment circuit 420 shifts the phase of the bit clock BCLK to create shifted bit clock SBCLK, having a timing edge aligned with the center of the data eye of the incoming serial data stream SERIN. Deserializer 410 takes shifted bit clock SBCLK and decodes incoming serial data stream SERIN, into received data nybble RDATA. Deserializer 410 is described in more detail in U.S. Pat. No. 5,367,542, issued to Guo on Nov. 22, 1994, incorporated herein by reference.

In this manner, the transceiver enables a structure to transmit a parallel set of bits serially to the metallized strip, so that every other structure can receive serially the parallel bits. For example, structure 100 sends a multiple bit signal to structure 104 by serializing the multiple bits into a serial data package, transmitting the serial data package through conductor 210 to metallized strip 200. Structure 104 received the serial data package from metallized strip 200 through conductor 214 and deserializes the serial data package back into the multiple bit signal. As a result, only one metallized strip, metallized strip 200, is needed to transmit multiple bit data.

Transmitting multiple bit data on one metallized strip is advantageous, because it simplifies the interconnection design of the chip. Furthermore, it advantageously reduces the resistance of interconnections, because the cross-sectional areas of the separate lines for the multiple bit data can be combined.

SHARED COMMUNICATIONS

Figure 5:
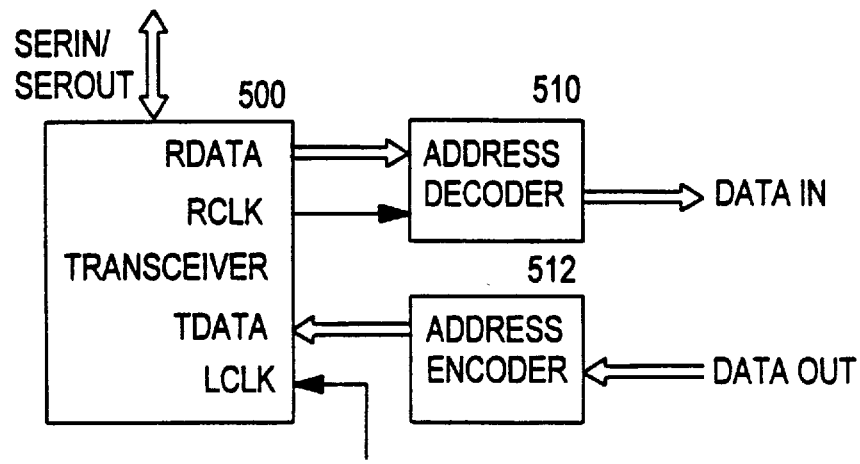
FIG. 5 is a block diagram of the interconnection circuitry of another embodiment of the invention.

In accord with the invention, each structure of a chip communicates with other substructures using various shared communications protocols over a metallized strip. Referring to FIG. 5, transceiver 500 implements a shared protocol by assigning an address to each substructure. Address encoder 512 of a source structure packages the address of the destination structure with a plurality of bits to be sent from the source structure to the destination structure. Transceiver 500 serializes the package received from address encoder 512 and sends the serialized package to metallized strip 200.

On the receiving end, transceiver 500 of each structure simultaneously receives, deserializes, and sends the package to address decoder 510. Address decoder 510 decodes the address from the package and checks the embedded address against the address assigned to that chip structure. If the addresses match, then address decoder 510 latches the plurality of bits for use in that chip structure.

The specific addresses assigned to the structures of the integrated circuit can be a simple serial number. However, any addressing scheme known in the art may be used. In fact, it is possible to use the ethernet addressing scheme and employ address encoder 512 to generate ethernet frames for the communication.

Figure 6:
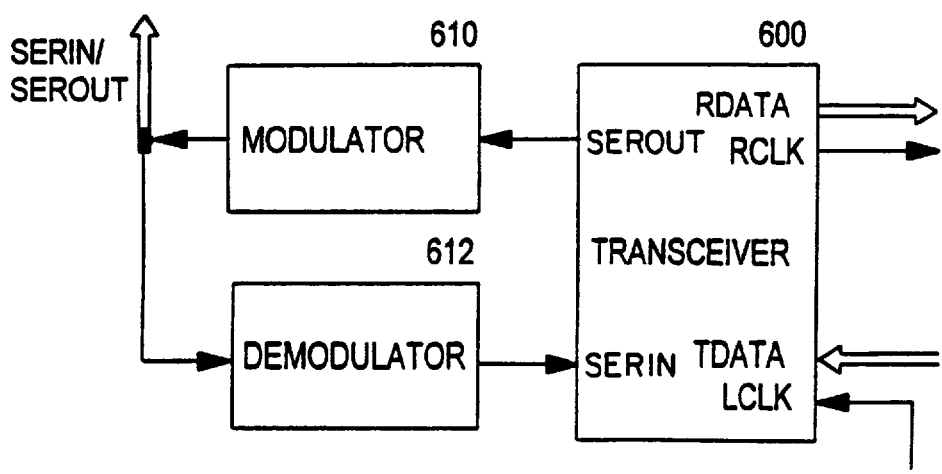
FIG. 6 is a block diagram of the interconnection circuitry of another embodiment of the invention.

Similarly, analog techniques, such as CDMA, can be used to provide broadband spectrum and simultaneous communications by sharing the available system bandwidth, limited by the physical characteristics of the metallized layer. In FIG. 6, analog shared communications techniques are implemented in one embodiment of the invention by interspersing modulator 610 and demodulator 612 between transceiver 600 and the conductor.

Modulator 610 receives a serialized digital signal SEROUT from transceiver 600 and converts the digital signal into an analog signal using techniques well known in the art. One technique, for example, is to encode the logical "low" at one frequency, such as 1200 Hz, and the logical "high" at another frequency, such as 2400 Hz. After the signal is modulated, modulator 610 transmits the signal through a conductor to metallized strip 200, and ultimately to other structures.

Demodulator 612 receives a modulated signal from metallized strip 200, converts the analog signal back into a digital serialized signal for the SERIN input of transceiver 600. Other pairs of structures may encode their signals at different frequencies, allowing multiple signals to coexist on the same metallized data plane.

The analog and digital techniques for sharing communications may be combined. For example, modulator 610 can use the addressing information encoded by address encoder 512 to select a frequency, corresponding to a destination structure, at which a signal is encoded. In this case, destination demodulator 612 is tuned to that frequency and receives only those signals destined for that structure. In this case, the modulation frequencies indicate the destination structure.

By sharing the same metallized strips, chip structures reduce the number of metallized strips that are designed and manufactured. In addition, with shared communications, many levels of metal layers over portions of the chip can advantageously be coalesced down to one layer. In this manner, chip production is simplified.

METALLIZED DATA PLANE

Using a shared communications protocol enables intra-chip communications to be passed through a metallized data plane, extending over a significant portion of a chip substrate and having a width at least an order of magnitude greater than a conventional metal strip.

Figure 7A:
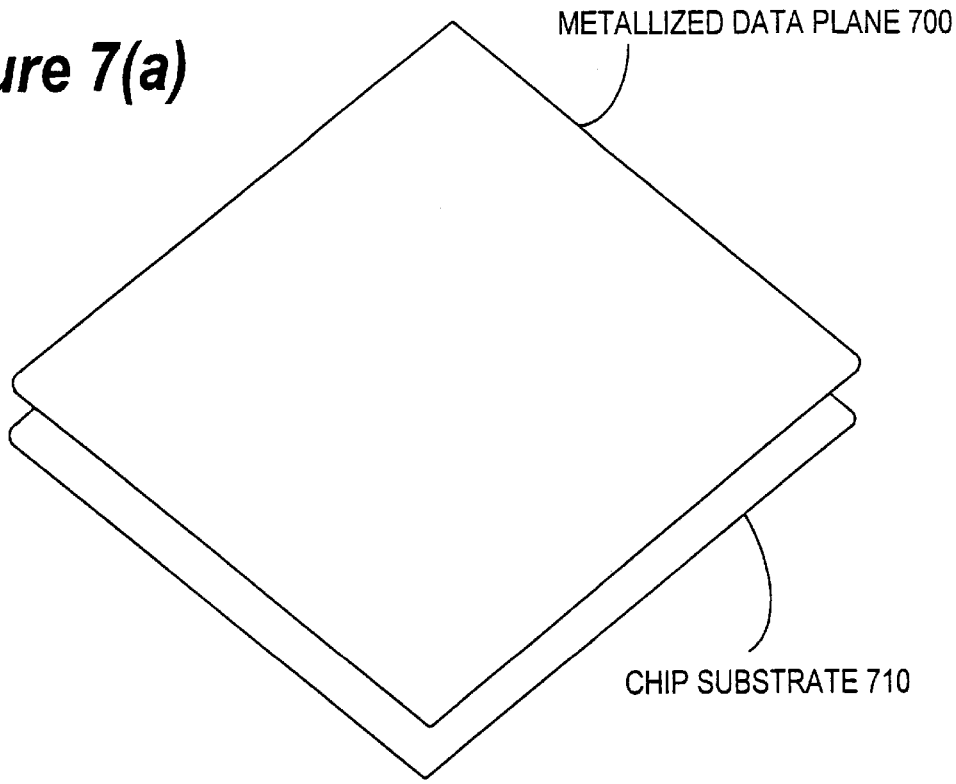
FIGS. 7(a) and 7(b) are perspective diagrams of metallized data planes of embodiments of the invention.

As shown in FIG. 7(a), one embodiment of the invention provides a metallized data plane 700 positioned above at least one point of every functional component or structure on chip substrate 710. For example, a signal processing region of a chip may be concentrated in one area of the chip substrate; thus, the metallized data plane would only need to extend over a significant portion of that signal processing region. As another example, the metallized data plane may extend over the entire chip substrate for ease of manufacture and design.

With a single metallized data plane the number of levels of interconnection over the entire chip is reduced down to one layer. The metallized data plane is positioned vertically above each chip structure, allowing conductors to interconnect the metallized data plane to the structures in a straight, vertical line instead of snaking. As a result, a single metallized data plane advantageously simplifies the design of the metallization layer and the interconnecting conductors.

In another embodiment, a metallized data plane is coupled to a pin, allowing the metallized data plane to be coupled to a metallized data plane of another device. Consequently, interconnecting the metallized data planes of a plurality of semiconductor devices through pin-to-pin connections enables communications between structures of separate devices.

On many integrated circuits, a clock signal is distributed to most functional components of the chip. Accordingly, one embodiment of the invention subdivides the single metallized layer into one or more clock planes to carry a clock signal and one or more data planes to carry various data signals with shared communication techniques.

Figure 7B:
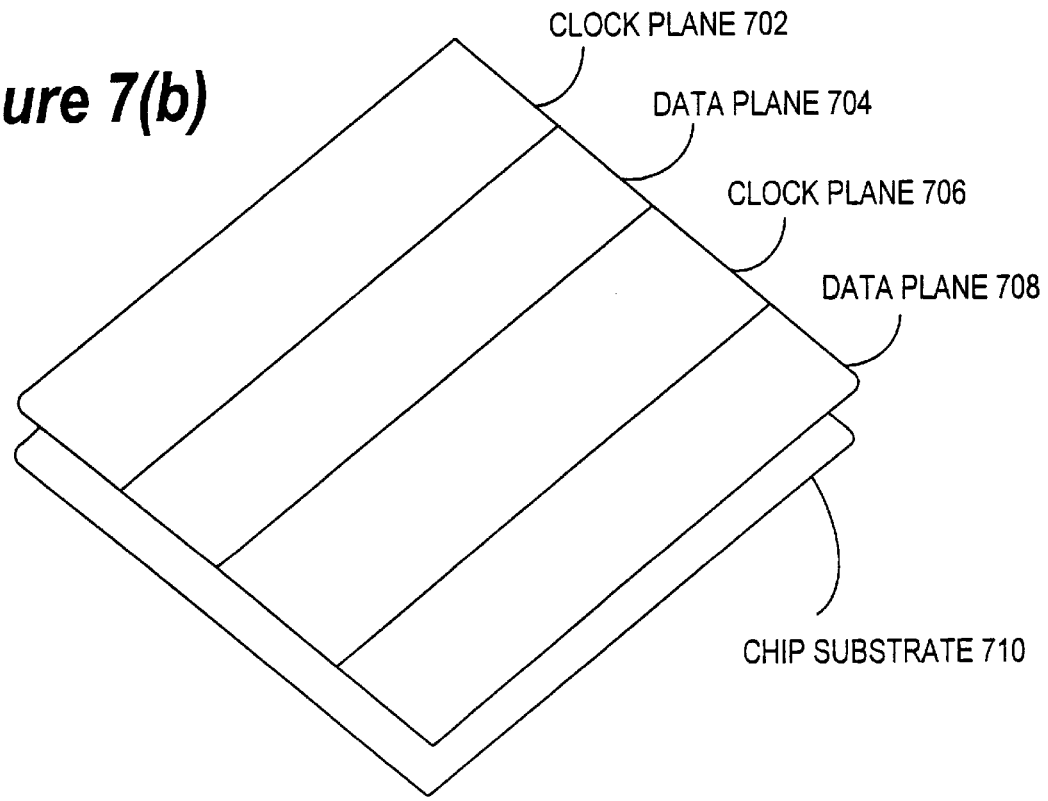

FIG. 7(b) depicts an integrated circuit with four metallized planes, clock planes 702 and 706 and data planes 704 and 708, each extending over about one quarter of chip substrate 710. In order to reduce snaking of interconnecting conductors, the clock plane is preferably subdivided into a plurality of metallized planes and separated from each other so that the average of the squared distance from a functional component to a clock plane is reduced.

Although the width of a clock plane and other metallized planes may be only one quarter, one eighth, or even one sixteenth of the width of the chip substrate, the width of the metallized plane is nonetheless significantly greater than the width of a conventional metallized strip. Accordingly, the cross-sectional area of a metallized plane is much greater than the conventional metallized strip. As a result, one advantage of such metallized strips is a lower electrical resistance than the conventional metallized strips.

In this disclosure there is shown and described only the preferred embodiments of the invention, but as aforementioned, it is to be understood that the invention is capable of use in various other combinations and environments and is capable of changes or modifications within the scope of the inventive concept as expressed herein.

What is claimed is:

1. A communications circuit for communicating between a first structure and a second structure on a substrate of an integrated circuit, comprising:

a metallized layer;

a first conductor that is substantially vertical with respect to said substrate, coupled to said metallized layer;

a first digital, high-speed transceiver coupled to said first structure and to said first conductor and configured for receiving parallel data from said first structure, serializing said parallel data into serial data, and transmitting said serial data to said metallized layer;

a second conductor that is substantially vertical with respect to said substrate, coupled to said metallized layer;

a second digital, high-speed transceiver coupled to said second structure and to said second conductor and configured for receiving serial data from said metallized layer, deserializing said serial data into said parallel data, and outputting said parallel data to said second structure.

2. The circuit of claim 1, wherein said metallized layer is positioned directly above said first structure and said second structure.

3. A communications circuit for communicating between a first structure and a second structure within an integrated circuit, comprising:

a metallized layer;

a first digital, high-speed transceiver coupled to said first structure and to said metallized layer and configured for receiving parallel data from said first structure, serializing said parallel data into serial data, and transmitting said serial data to said metallized layer;

a second digital, high-speed transceiver coupled to said second structure and to said metallized layer and configured for receiving serial data from said metallized layer, deserializing said serial data into said parallel data, and outputting said parallel data to said second structure;

an address encoder interspersed between and coupling said first transceiver and said first structure and configured for appending addressing information to said parallel data; and an address decoder interspersed between and coupling said second transceiver and said second structure and configured for outputting said parallel data to said second structure in response to said appended addressing information.

4. The circuit of claim 3, wherein said addressing information defines an ethernet frame.

5. A communications circuit for communicating between a first structure and a second structure within an integrated circuit, comprising:

a metallized layer;

a first digital, high-speed transceiver coupled to said first structure and to said metallized layer and configured for receiving parallel data from said first structure, serializing said parallel data into serial data, and transmitting said serial data to said metallized layer;

a second digital, high-speed transceiver coupled to said second structure and to said metallized layer and configured for receiving serial data from said metallized layer, deserializing said serial data into said parallel data, and outputting said parallel data to said second structure;

a modulator interspersed between and coupling said first transceiver and said metallized layer and configured for modulating said serial data; and a demodulator interspersed between and coupling said second transceiver and said metallized layer and configured for demodulating said serial data.

6. The circuit of claim 5, further comprising an address encoder interspersed between and coupling said first transceiver and first structure and configured for appending addressing information to said parallel data.

7. The circuit of claim 6, further comprising an address decoder interspersed between and coupling said second transceiver and said second structure and configured for outputting said parallel data to said second structure in response to said appended addressing information.

8. The circuit of claim 1, further comprising a pin coupled to said metallized layer.

9. An integrated circuit comprising:

a plurality of components on a substrate;

a metallized plane, positioned above a significant portion of said substrate; and wherein each of said plurality of components comprises data serialization and deserialization circuitry coupled to said component and coupled to said metallized plane by a conductor that is substantially vertical with respect to said substrate for shared communication between said components through said metallized plane.

10. The integrated circuit of claim 9, wherein said metallized plane has a width of at least one-sixteenth of the width of said substrate.

11. The integrated circuit of claim 9, wherein said metallized plane extends over at least one point of each of said components.

12. The integrated circuit of claim 9, further comprising a metallized clock plane coupled to said plurality of said components for distributing a clock signal to said plurality of said components.

13. The integrated circuit of claim 12, wherein said metallized clock plane has a width at least one sixteenth of the width of said substrate.

14. The integrated circuit of claim 9, further comprising a pin coupled to said metallized plane.

15. The integrated circuit of claim 9, wherein said metallized plane has a width of at least one-fourth of the width of said substrate and a length of the length of the substrate.

16. The integrated circuit of claim 9, wherein said metallized plane extends over all of said substrate.

* * * * *

UNITED STATES PATENT AND TRADEMARK OFFICE
CERTIFICATE OF CORRECTION

PATENT NO. : 5,886,539
DATED : March 23, 1999
INVENTOR(S) : Russell BELL

It is certified that error appears in the above-identified patent and that said Letters Patent is hereby corrected as shown below:

On the title page, under [73] Assignee, change "Ind." to --Inc.--

Signed and Sealed this

Twenty-seventh Day of July, 1999

Attest:

Q. TODD DICKINSON

*Attesting Officer*　　　*Acting Commissioner of Patents and Trademarks*